(12) United States Patent
Yokoi

(10) Patent No.: US 6,664,823 B2
(45) Date of Patent: Dec. 16, 2003

(54) INVERTER OUTPUT CIRCUIT

(75) Inventor: Shizuka Yokoi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 19 days.

(21) Appl. No.: 10/282,368

(22) Filed: Oct. 29, 2002

(65) Prior Publication Data

US 2003/0102893 A1 Jun. 5, 2003

(30) Foreign Application Priority Data

Nov. 30, 2001 (JP) .......................... 2001-366747

(51) Int. Cl.$^7$ .......................... H03K 3/00; H03H 11/26
(52) U.S. Cl. .................. 327/108; 327/333; 327/276; 327/262
(58) Field of Search ................. 327/108, 333, 327/261, 262, 263, 264, 269, 270–272, 276–278, 284, 285; 326/80, 81

(56) References Cited

U.S. PATENT DOCUMENTS

| | | | |
|---|---|---|---|
| 5,068,553 A | * 11/1991 | Love | 327/262 |
| 5,467,044 A | * 11/1995 | Ashe et al. | 327/333 |
| 5,994,937 A | * 11/1999 | Hara et al. | 327/262 |
| 6,034,557 A | * 3/2000 | Schultz et al. | 327/276 |

* cited by examiner

*Primary Examiner*—Toan Tran
(74) *Attorney, Agent, or Firm*—Hogan & Hartson, LLP (57) ABSTRACT

An inverter output circuit comprises first though third inverters connected in series. The low-potential output of the first inverter has an offset level. The input threshold voltage of the second inverter is set up at a lower level than the low-level offset potential of the first inverter as the level of supply voltage Vdd falls below a predetermined reference level. Thus, the third inverter is fixed to a predetermined condition if the supply voltage drops below the reference voltage, thereby preventing erratic operations of a load connected to the inverter output circuit caused by, for example, a power shut down and a brownout.

13 Claims, 8 Drawing Sheets

FIG. 1

PRIOR ART

INVERTER OUTPUT CIRCUIT

FIELD OF THE INVENTION

The invention relates to an inverter output circuit for driving a load such as a light emitting diode (LED) and a liquid crystal display (LCD).

BACKGROUND OF THE INVENTION

Figure 1:
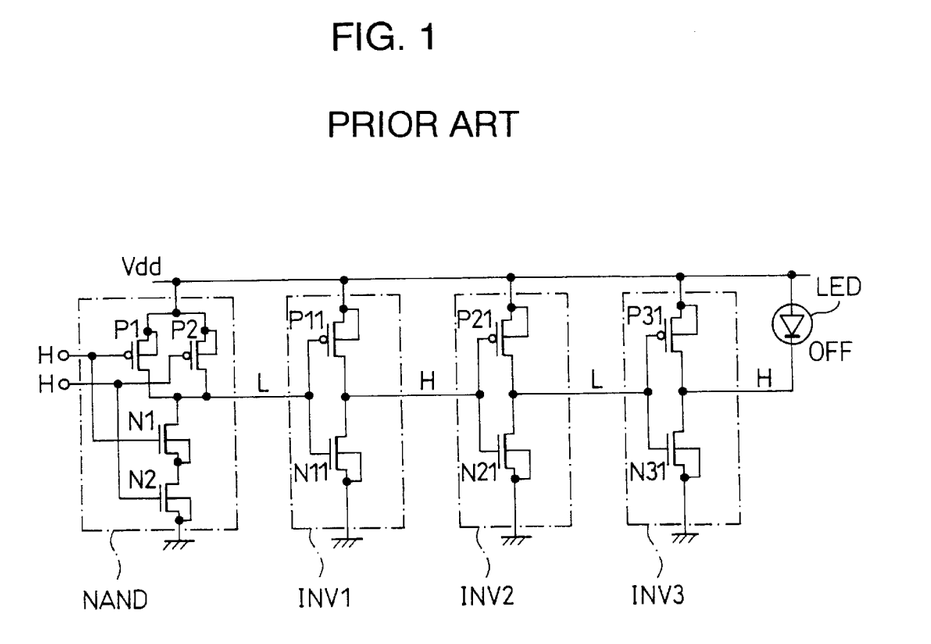
FIG. 1 shows a conventional inverter output circuit.

FIG. 1 shows a circuit having a conventional inverter output circuit for driving an LED. This circuit includes a NAND circuit and serially connected first through third inverters INV1–INV3, respectively, for outputting a power to control ON/OFF operation of the LED.

The NAND circuit includes a pair of P-type MOS transistors P1 and P2 connected in parallel with each other and a pair of N-type MOS transistors N1 and N2 connected in series with each other and with the paired MOS transistors P1 and P2. The first through third inverters INV1–INV3 each consist of a P-type MOS transistor (P11–P31) and an N-type MOS transistor (N11–N31). A supply voltage of Vdd, with respect to the-ground potential, is provided to the NAND circuit and the inverters INV1–INV3 as the operating voltage thereof.

Figure 2:
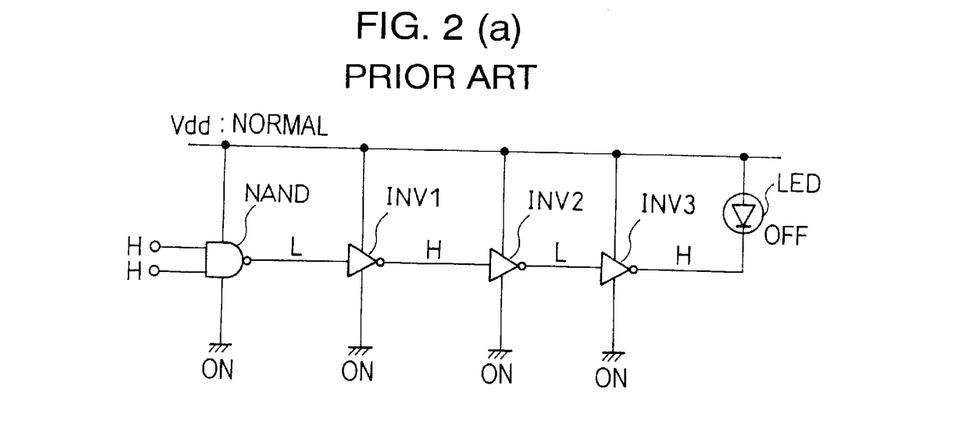
FIGS. 2(a)–(c) show the operations of the circuit shown in FIG. 1.

Referring to FIG. 2, operations of the circuit shown in FIG. 1 will now be discussed below. When the supply voltage Vdd has a normal voltage, the NAND circuit outputs a low level signal (referred to as L-level output) when the NAND circuit receives at the two input terminals thereof high level signals (referred to as H-level inputs), as shown in FIG. 2(a). The L-level output is inverted in sequence in the first through third inverters INV1–INV3, finally providing a H-level signal (referred to as H-level output). This H-level output will turn OFF the LED. On the other hand, when the NAND circuit receives at its input terminals other signals (i.e. signals of H- and L-inputs, L- and H-inputs, and L-level inputs), the diode LED will be turned ON.

In this way, the NAND circuit controls the ON/OFF operation of the LED through the inversions of the input signal by the respective inverters INV1–INV3.

However, if the supply voltage Vdd is gradually lowered on account of, for example, shut down of the supply voltage, the NAND circuit can fail to output a correct signal from the third inverter INV3 in response to the input signal it receives at the input terminals. In what follows, the condition of the inverter circuit in which the circuit can provide a correct output will be referred to as ON status, and otherwise the condition referred to as OFF status.

As shown in FIG. 1, the NAND circuit usually contains more transistors than inverters INV1–INV3 and hence requires a higher source-drain voltage than the inverters. Because of this, as the supply voltage Vdd lowers from the nominal level, the NAND circuit is turned OFF at a voltage which is still higher than the turn-off voltage of the inverters INV1–INV3, and the output of the NAND circuit is fixed to either the H-level or the L-level.

FIG. 2(b) shows such condition as discussed above. Suppose now that the supply voltage Vdd has lowered from the nominal voltage to a certain lower level Vdd1 causing the NAND circuit to fall into the OFF status, irrespective of whether or not both the input signals have H-level or not, resulting in a H-level output. In this case, the H-level output will be inverted by the enabled inverters INV1–INV3 in sequence, with the third inverter INV3 generating L-level output. As a result, the LED will be turned ON by the L-level output.

As the supply voltage Vdd further lowers to a level Vdd2 say, where Vdd1>Vdd2, all the inverters will fall in the OFF status, thereby turning OFF the LED.

Thus, the LED that has been turned OFF will be turned ON once again for a while as the supply voltage Vdd lowers from the nominal level to a sufficiently low level.

Moreover, when the supply voltage Vdd is lower than the nominal voltage for some reason, the NAND circuit and each of the inverters INV1–INV3 can behave inconsistently based on their operational conditions, resulting in erratic operations of the LED.

SUMMARY OF THE INVENTION

It is, therefore, an object of the invention to provide an inverter output circuit for correctly driving a load in response to a given input signal if the supply voltage is shut down or lowered.

In one aspect of the invention, there is provided an inverter output circuit, comprising:

a first inverter impressed by a supply voltage given by the difference between a first (high) level potential of a first power supply and a second (low) potential of a second power supply, said first inverter adapted to generate, in accordance with the level of an input signal fed, either
  a high level output which equals the high potential of said first power supply, or
  a low level (L-level) offset output which is higher than said second potential of said second power supply by a predetermined offset voltage; and a second inverter impressed by said supply voltage and receiving the output of said first inverter, said second inverter adapted to output either said high level output or a low level output in accordance with the level of the output received, wherein the input threshold voltage of said second inverter is set up at a higher level than said L-level offset output when said supply voltage is higher than a predetermined reference voltage, and otherwise set up at a lower level than said L-level offset output.

In accordance with an inverter output circuit of the invention, the input threshold voltage Vth2 of the second inverter INV2 becomes lower than the L-level offset output Voff of the first inverter INV1 when the supply voltage Vdd has lowered below the nominal level, and thus the subsequent inverters (including the second inverter INV2) will assume correct ON/OFF status to maintain the load turned off.

DETAILED DESCRIPTION OF THE PREFERRED EMBODIMENT

Figure 3:
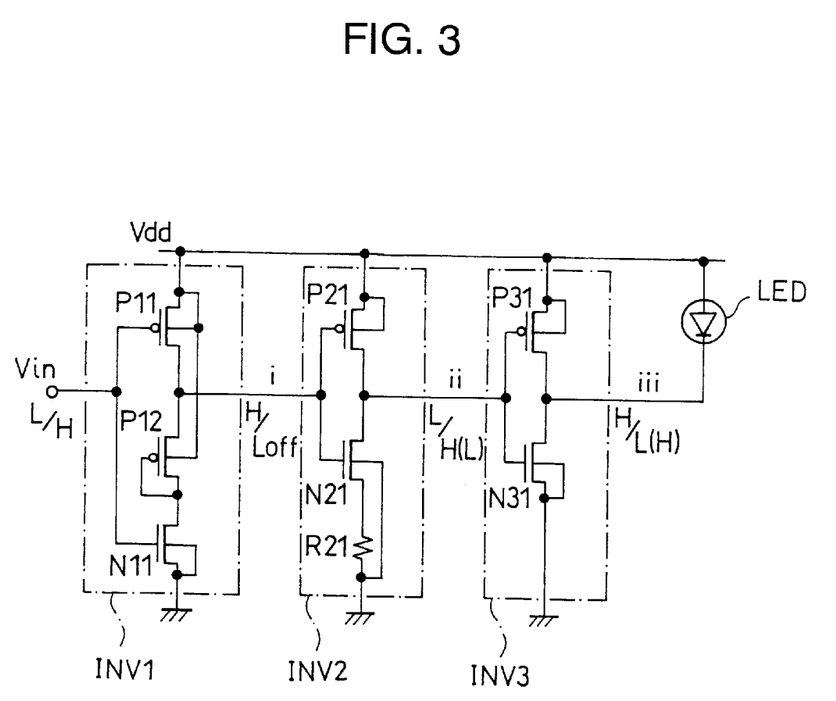
FIG. 3 shows an inverter output circuit according to the invention.
Figure 4:
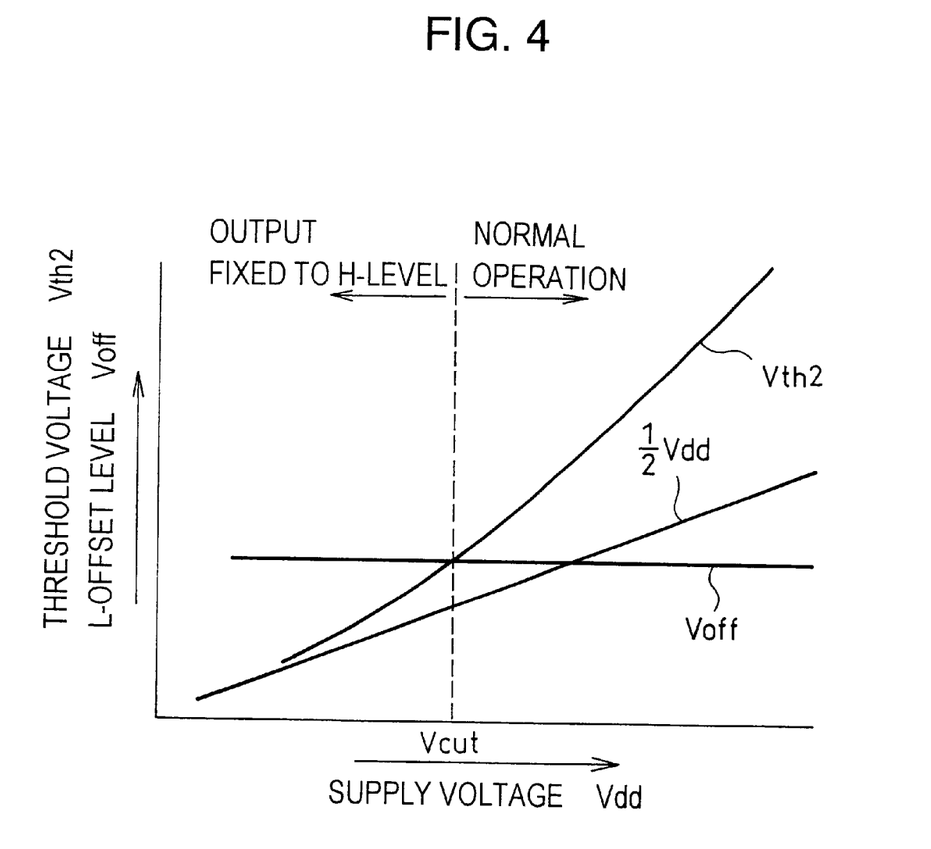
FIG. 4 shows the low (L)-offset level of the output of the first inverter and the input threshold voltage of the second inverter of FIG. 3 plotted against the supply voltage.

FIG. 3 shows an embodiment of an inverter circuit of the invention, connected to an LED. FIG. 4 shows the L-level offset potential Voff of the output of the inverter INV1 (the potential level hereinafter referred to as L-offset level) and the input threshold voltage Vth2 as a function of the supply voltage Vdd. FIGS. 5(a) and (b) show the output voltages of the respective inverters as a function of the input voltage Vin when the inverters are operating under a normal supply voltage, and under a low supply voltage, respectively.

As shown in FIG. 3, the first through third inverters INV1–INV3 are connected in series. The LED is turned ON if the output level of the third inverter INV3 is low (L), and turned OFF otherwise.

The first inverter INV1 includes a P-type MOS transistor P11, another P-type MOS transistor P12, and an N-type MOS transistor N11, all connected in series in the order mentioned between the power supply of voltage Vdd and the ground. The gates of the P-type MOS transistor P11 and N-type MOS transistor N11 are coupled to a common input voltage Vin. This input voltage is supplied from a logic circuit such as a NAND circuit as shown in FIG. 1 in the preceding stage (not shown).

The P-type MOS transistor P12 has a drain and a gate connected together (transistor having such connection referred to as diode-connected MOS transistor) and behaves like a diode, exhibiting a substantially constant voltage drop. In other words, the voltage drop is little affected by the variation of the supply voltage Vdd. The magnitude of the voltage drop across the P-type MOS transistor P12 is determined by the size of the transistor P12, and by the balance in performance of the P-type MOS transistor P11 and the N-type MOS transistor N11. The substrate of the P-type MOS transistor P12 is connected to the supply voltage Vdd which is higher than the source voltage, so that the substrate creates a large voltage drop due to the substrate bias effect.

The output i of the first inverter INV1 is taken out from the node of the P-type MOS transistors P11 and P12. The H-level output of the first inverter INV1 is substantially equal to the supply voltage Vdd when the P-type MOS transistor P11 is conductive. However, its L-level output is higher than the ground potential by the offset voltage due to the voltage drop across the P-type MOS transistor P12.

The second inverter INV2 includes a P-type MOS transistor P21, an N-type MOS transistor N21, and a resistor R21, all connected in series in the order mentioned between the supply voltage Vdd and the ground. The gates of the P-type MOS transistor P21 and the N-type MOS transistor N21 are coupled together to receive the output i of the inverter INV1. The output ii of the inverter INV2 is taken out from the node of the P-type MOS transistor P21 and the N-type MOS transistor N21.

The resistor R21 is provided to regulate the input threshold voltage Vth2 of the second inverter INV2. The current through the resistor R21 increases with the supply voltage Vdd, which in turn increases the source potential of the N-type MOS transistor N21. Because of this mechanism, the input threshold voltage Vth2 has a positive Vdd-dependence. The input threshold voltage Vth2 is set up at an appropriate level by balancing the performance of the P-type MOS transistor P21 and N-type MOS transistor N21 and by regulating the resistance of the resistor R21.

The output ii of the inverter INV2 assumes the H-level equal to the supply voltage Vdd and the L-level equal to ground potential, according to the ON and OFF status of the P-type MOS transistor P21 and the N-type MOS transistor N21.

The third inverter INV3 has an ordinary inverter configuration in which a P-type MOS transistor P31 and an N-type MOS transistor N31 are connected in series in this order between the voltage supply of Vdd and the ground. The output ii of the inverter INV2 is supplied to the inverter INV3. The output iii of the inverter INV3 is taken out from the node of the P-type MOS transistor P31 and the N-type MOS transistor N31.

The output iii of the inverter INV3 assumes the H-level given by the supply voltage Vdd and the L-level equal to the ground potential, according to the ON and OFF status of the P-type MOS transistor P31 and the N-type MOS transistor N31. The output of the inverter INV3 is supplied to the LED.

Figure 5:
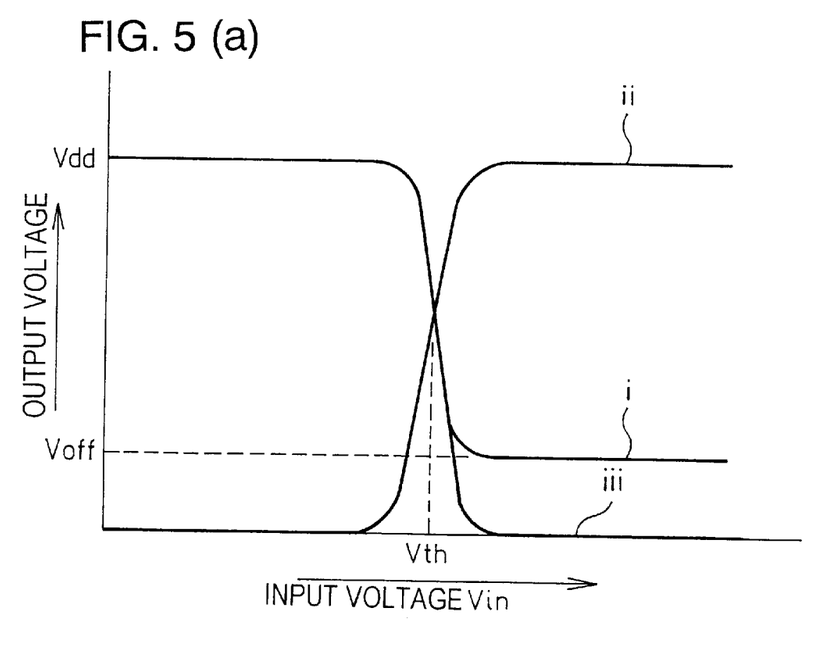
FIG. 5(a) shows the input and output voltages of the respective inverters of FIG. 3 under a normal operating condition.
FIG. 5(b) shows the input and output voltages of the inverters operating under a low supply voltage.

With additional cutoff to FIGS. 4 and 5, operations of the embodiment will be described below.

Referring first to FIG. 4, the L-offset level, Voff, of the inverter INV1 is substantially constant, due to the fact that it is little influenced by the supply voltage Vdd. On the other hand, the input threshold voltage Vth2 of the inverter INV2 changes with the supply voltage Vdd.

The input threshold voltage Vth2 will be sufficiently higher than the L-offset level Voff when the inverter INV2 is conductive under a high supply voltage Vdd. The input threshold voltage Vth2 decreases with the supply voltage Vdd. As the supply voltage Vdd becomes lower than a certain critical level, the input threshold voltage Vth2 becomes lower than the L-offset level Voff. The level at which the input threshold voltage Vth2 and the L-offset level Voff coincide will be referred to as cutoff voltage Vcut. In FIG. 4, there is shown for purposes of reference a line indicating the level of ½ the nominal Vdd.

When the supply voltage Vdd is higher than the cutoff voltage (reference voltage) Vcut, then Vth2>Voff and normal inverter operation will take place.

However, when the supply voltage Vdd is lower than the cutoff voltage Vcut, then Vth2<Voff. In this case ordinary or normal inverter operation cannot take place any longer, and the output ii of the inverter INV2 is fixed to the L-level irrespective of the output i of the inverter INV1. Thus, the output iii of the inverter INV3, or the output of the inverter output circuit, is then fixed to H-level. Accordingly, the LED remains turned OFF.

The level of the supply voltage Vdd for which the output iii of the inverter output circuit is fixed to the H-level can be set by adjusting the input threshold voltage Vth2 and the L-offset level Voff.

The input voltage versus output voltage relationships are shown in FIG. 5(a) for the respective inverters in normal operation under a sufficiently high supply voltage Vdd. In the example shown herein, the input threshold voltage Vth2 is much higher than the L-offset level Voff, so that the first through third inverters INV1–INV3 correctly provide respective high (H-level)/low (L-level) outputs according to the level of the respective input voltages Vin. Therefore, the LED can be turned ON or OFF according to whether the input signal Vin has the H-level or L-level.

However, when the supply voltage Vdd drops to a certain reference level, rendering Vth2<Voff, the input-output voltage relationships of the respective inverters will change to what is shown in shown in FIG. 5(b). Under this condition, since the input threshold voltage Vth2 of the inverter INV2 is lower than the L-offset level Voff of the inverter INV1, the output of the inverter INV2 is fixed to the L-level, while the output of the inverter INV3 is fixed to the H-level.

As a result, the output supplied to the LED is automatically fixed to the H-level.

Consider a case where the supply voltage Vdd is shut down at some point in time when the input to the inverter output circuit is low (L-level) with the output of the circuit being high (H-level), and accordingly the supply voltage gradually decreases. It will be appreciated that in this case the LED will never be erratically turned on if the input signal jumps to the H-level for unknown reasons. Similarly, if the supply voltage Vdd has dropped below the nominal level for some reason during a normal operation, the output of the circuit of the invention is fixed to the H-level, thereby preventing erratic operation of the LED.

In the embodiment as described above, the first inverter INV1 presumably has a substantially constant L-offset level Voff, and the input threshold voltage Vth2 of the second inverter INV2 has a positive Vdd-dependence.

It should be understood, however, that the invention is fulfilled so long as the input threshold Vth2 satisfies the following conditions based on the cutoff voltage Vcut for the supply voltage Vdd:

Vth2≧Voff if Vdd≧Vcut, and

Vth2<Voff otherwise.

Under the conditions, the inverter output circuit of the invention can work properly in any of the following cases: (1) The L-offset level, Voff, does not depend on the level of the supply voltage Vdd and the input threshold voltage Vth2 has a positive Vdd-dependence; (2) The L-offset level, Voff, has a negative Vdd-dependence and the input threshold voltage Vth2 has no Vdd-dependence; (3) The L-offset level, Voff, has a negative Vdd-dependence and the input threshold voltage Vth2 has a positive Vdd-dependence; (4) Both the L-offset level Voff and the input threshold voltage Vth2 have a positive Vdd-dependence; and (5) Both the L-offset level Voff and the input threshold voltage Vth2 have a negative Vdd-dependence.

Figure 6:
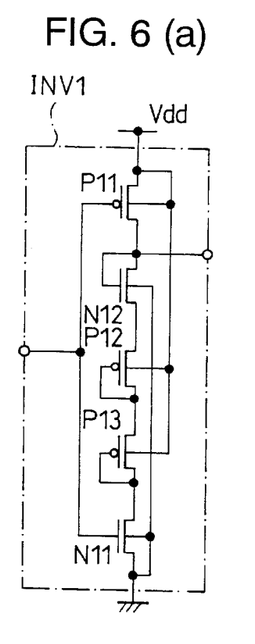
FIGS. 6(a)–(c) show modifications of a first inverter INV1.

FIGS. 6(a)–(c) show exemplary modifications of a first inverter INV1 applicable to the cases listed above.

FIG. 6(a) shows means for implementing the offset voltage, including an N-type MOS transistor N12, P-type MOS transistors P12 and P13, each diode-connected and all connected in series together between a P-type MOS transistor P11 and an N-type MOS transistor N11. The substrate of the N-type MOS transistor N12 is grounded together with the substrate and the source of the N-type MOS transistor N11. The substrates of the P-type MOS transistors P12 and P13 are connected to the supply voltage Vdd together with the substrate and the source of the P-type MOS transistor P11. Thus, in this arrangement each of the N-type MOS transistor N12 and P-type MOS transistors P12 and P13 is configured to have a respective higher voltage drop due to so-called substrate bias effect.

The MOS transistors used in the first inverter INV1 for acquiring a proper offset voltage can be all N-type MOS transistors, or alternatively a combination of P-type and N-type MOS transistors. The number of the P-type and N-type MOS transistors in the arrangement is determined arbitrarily, as needed.

When both types of transistors are used, it is anticipated that the variation of L-offset level, Voff, arising from impurity fluctuations in the manufacturing process is advantageously alleviated. It is necessary, however, that if both types of transistors are used the threshold voltage Vth2 must be set up at a higher voltage as compared to cases where a single MOS transistor is used. For this reason, it is recommended that, in most cases the first inverter INV1 is provided with only one offsetting transistor (for transistor economy) and the second inverter INV2 is provided with a resistor for giving the second inverter INV2 additional Vdd-dependence that helps suppress influences of fluctuations in manufacture of transistors, as shown in FIG. 3.

FIG. 6(b) shows an example in which the first inverter is provided with a substrate voltage generation circuit serving as means for implementing the offset voltage. This circuit generates a substrate voltage to be supplied to the P-type MOS transistor P12. The substrate voltage generation circuit has P-type MOS transistors P14, P15 and P16, each diode-connected and all connected in series together in the order mentioned between the P-type MOS transistor P13 and the N-type MOS transistor N12 that function as an inverter. The drain voltage of the P-type MOS transistor P13 is impressed on the substrate of the P-type MOS transistor P12 as the controlled substrate voltage therefor, thereby regulating the L-offset level Voff of the inverter INV1.

FIG. 6(c) shows an example in which a diode is used in place of a diode-connected MOS transistor for generating the offset voltage. The diode also provides the same functionality as the diode-connected MOS transistor.

Figure 7:
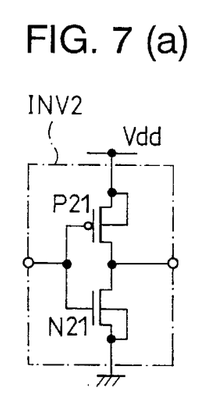
FIGS. 7(a)–(c) show modifications of a second inverter INV2.

FIGS. 7(a)–(c) show exemplary modifications of the second inverter INV2. In particular, FIG. 7(a) shows an inverter having no means for regulating the input threshold voltage Vth2. In other words, the inverter INV2 is an ordinary inverter consisted of a P-type MOS transistor P21 and an N-type MOS transistor N21. The input threshold voltage Vth2 of this inverter also increases with the supply voltage Vdd.

For a given cutoff voltage Vcut for the supply voltage Vdd as in the foregoing embodiment, this inverter output circuit works well when the input threshold voltage Vth2 is set up such that Vth2≧Voff if Vdd≧Vcut, and Vth2<Voff otherwise.

This is the case in other examples.

FIG. 7(b) shows a second inverter INV2 utilizing a diode-connected N-type MOS transistor N22 as means for regulating the input threshold voltage Vth2. This arrangement of the N-type MOS transistor N22 also provides the same functionality as the preceding example.

FIG. 7(c) shows a second inverter INV2 utilizing diode-connected P-type MOS transistor P22 and resistor R21 connected in series as means for regulating the input threshold voltage Vth2. This arrangement also provides the same functionality as the preceding examples.

Figure 8:
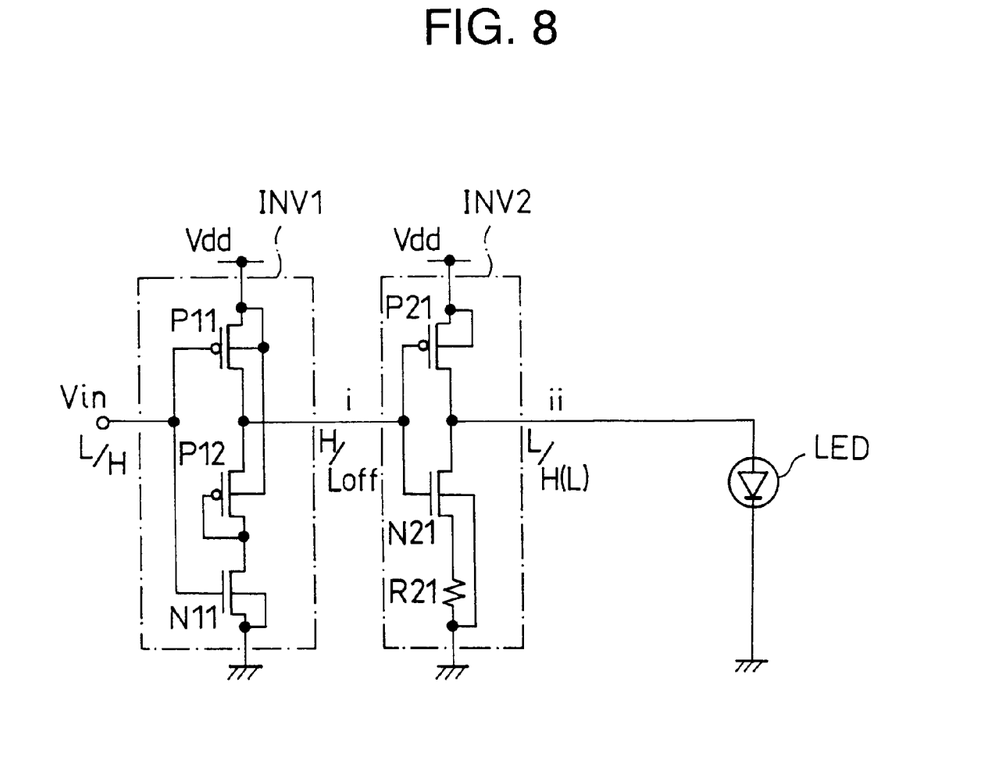
FIG. 8 show an inverter output circuit with the third inverter of FIG. 3 omitted according to the invention.

It is possible in these embodiments to omit the third inverter INV3 if the second inverter INV2 has a sufficient output power to drive the load (e.g. diode LED). An example of such inverter output circuit with a third inverter INV3 omitted is shown in FIG. 8. In this inverter output circuit, the LED is connected between the output end of the second inverter INV2 and the ground, whereby the LED is turned ON or OFF according to whether the level of the input voltage Vin is H-level or L-level.

As described above, an inverter output circuit of the invention has a simple structure, including only a few transistors and a few resistors, yet it is capable of providing correct inverted output even when the circuit has encountered a power shut down or a sudden drop of the supply voltage.

It will be appreciated that the inverter output circuit of the invention can provide a correctly inverted output independently of the speed of voltage drop in the power supply. Therefore, the circuit can be advantageously applied to various apparatuses that are driven by batteries.

I claim:

1. An inverter output circuit, comprising:
a first inverter impressed by a supply voltage given by the difference between a first (high) level potential of a first power supply and a second (low) potential of a second power supply, said first inverter adapted to generate, in accordance with the level of an input signal fed, either
a high level output which equals the high potential of said first power supply, or
a low level (L-level) offset output which is higher than said second potential of said second power supply by a predetermined offset voltage; and
a second inverter impressed by said supply voltage and receiving the output of said first inverter, said second inverter adapted to output either said high level output or a low level output in accordance with the level of the output received, wherein
the input threshold voltage of said second inverter is set up at a higher level than said L-level offset output when said supply voltage is higher than a predetermined reference voltage, and otherwise set up at a lower level than said L-level offset output.

2. The inverter output circuit according to claim 1, further comprising a third inverter adapted to receive the output of said second inverter to generate an output which is equal to said high level output or low level output in accordance with the output received.

3. The inverter output circuit according to claim 1, wherein
said first inverter has a P-type MOS transistor, at least one diode-connected MOS transistor, and an N-type MOS transistor, all connected in series in the order mentioned between said two power supplies;
said input signal is supplied to the gates of said P-type MOS transistor and N-type MOS transistor; and
the output of said first inverter is taken out from the node of said P-type MOS transistor and diode-connected MOS transistor.

4. The inverter output circuit according to claim 3, wherein said diode-connected MOS transistor is an N-type MOS transistor.

5. The inverter output circuit according to claim 3, wherein said diode-connected MOS transistor is a P-type MOS transistor.

6. The inverter output circuit according to claim 3, wherein said diode-connected MOS transistor includes a P-type MOS transistor and an N-type MOS transistor.

7. The inverter output circuit according to claim 1, wherein
said first inverter has a P-type MOS transistor, at least one diode, and an N-type MOS transistor, all connected in series in the order mentioned, between said two power supplies,
said input signal is supplied to the gates of said P-type MOS transistor and N-type MOS transistor, and
the output of said first inverter is taken out from the node of said P-type MOS transistor and diode.

8. The inverter output circuit according to claim 1, wherein said second inverter has a P-type MOS transistor, an N-type MOS transistor, and a resistor, all connected in series in the order mentioned, between said two power supplies;
the output of said first inverter is supplied to the gates of said P-type MOS transistor and N-type MOS transistor; and
the output of said second inverter is taken out from the node of said P-type MOS transistor and N-type MOS transistor.

9. The inverter output circuit according to claim 1, wherein said second inverter has a P-type MOS transistor and an N-type MOS transistor, both connected in series in the order mentioned between said two power supplies;
said input signal is supplied to the gates of said P-type MOS transistor and N-type MOS transistor, and
the output of said second inverter is taken out from the node of said P-type MOS transistor and N-type MOS transistor.

10. The inverter output circuit according to claim 1, wherein
said first inverter has a first P-type MOS transistor, at least one diode-connected MOS transistor, and a first N-type MOS transistor, all connected in series in the order mentioned between said two power supplies;
said input signal is supplied to the gates of said first P-type MOS transistor and first N-type MOS transistor;
the output of said first inverter is taken out from the node of said first P-type MOS transistor and diode-connected MOS transistor;
said second inverter has a second P-type MOS transistor, a second N-type MOS transistor, and a resistor, all connected in series in the order mentioned between said two power supplies;
the output of said first inverter is supplied to the gates of said second P-type MOS transistor and second N-type MOS transistor, and
the output of said second inverter is taken out from the node of said second P-type MOS transistor and second N-type MOS transistor.

11. The inverter output circuit according to claim 10, further comprising a third inverter adapted to receive the output of said second inverter to output said high level output and said low level output in accordance with the level of the output received, wherein
said third inverter has a third P-type MOS transistor and a third N-type MOS transistor, both connected in series in the order mentioned between said two power supplies;
the output of said second inverter is supplied to the gates of said third P-type MOS transistor and third N-type MOS transistor; and
the output of said third inverter is taken out from the node of said third P-type MOS transistor and third N-type MOS transistor.

12. The inverter output circuit according to claim 1, wherein
said first inverter has a first P-type MOS transistor, at least one diode, and a first N-type MOS transistor, all connected in series in the order mentioned between said two power supplies;
said input signal is supplied to the gates of said first P-type MOS transistor and first N-type MOS transistor;
the output of said first inverter is taken out from the node of said first P-type MOS transistor and diode;
said second inverter has a second P-type MOS transistor, a second N-type MOS transistor, and a resistor, all connected in series in the order mentioned between said two power supplies;

the output of said first inverter is supplied to the gates of said second P-type MOS transistor and second N-type MOS transistor, and the output of said second inverter is taken out from the node of said second P-type MOS transistor and second N-type MOS transistor.

13. The inverter output circuit according to claim 12, further comprising a third inverter adapted to receive the output of said second inverter to output said high level output and said low level output in accordance with the level of the output received, wherein said third inverter has a third P-type MOS transistor and a third N-type MOS transistor, both connected in series in the order mentioned between said two power supplies;

the output of said second inverter is supplied to the gates of said third P-type MOS transistor and third N-type MOS transistor, and the output of said third inverter is taken out from the node of said third P-type MOS transistor and third N-type MOS transistor.

\* \* \* \* \*